(12) United States Patent  
Fujiwara et al.

(10) Patent No.: US 9,177,989 B2  
(45) Date of Patent: Nov. 3, 2015

(54) IMAGING DEVICE

(71) Applicant: KABUSHIKI KAISHA TOSHIBA, Tokyo (JP)

(72) Inventors: Ikuo Fujiwara, Yokohama (JP); Hideyuki Funaki, Tokyo (JP); Kenji Todori, Yokohama (JP); Akira Fujimoto, Kawasaki (JP); Tsutomu Nakanishi, Yokohama (JP); Kenji Nakamura, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 227 days.

(21) Appl. No.: 13/799,752

(22) Filed: Mar. 13, 2013

(65) Prior Publication Data

US 2014/0139714 A1   May 22, 2014

(30) Foreign Application Priority Data

Nov. 16, 2012   (JP) ................. 2012-252518

(51) Int. Cl.
*H01L 27/148* (2006.01)
*H01L 21/00* (2006.01)
*H01L 27/146* (2006.01)

(52) U.S. Cl.
CPC .... *H01L 27/14665* (2013.01); *H01L 27/14609* (2013.01); *H01L 27/14612* (2013.01); *H01L 27/14636* (2013.01); *H01L 27/14638* (2013.01)

(58) Field of Classification Search
CPC .................... H01L 27/14; H01L 31/14
USPC ........... 257/229, 239, 258, 292; 438/57, 70
See application file for complete search history.

(56) References Cited

U.S. PATENT DOCUMENTS

| | | | |
|---|---|---|---|
| 8,816,458 B2* | 8/2014 | Sato et al. | 257/432 |
| 2011/0180688 A1* | 7/2011 | Nakahara | 250/208.1 |
| 2011/0215433 A1* | 9/2011 | Kokubun | 257/448 |
| 2012/0097225 A1* | 4/2012 | Nomura et al. | 136/255 |

FOREIGN PATENT DOCUMENTS

| | | |
|---|---|---|
| JP | 2009-38352 | 2/2009 |
| JP | 2011-187857 | 9/2011 |

* cited by examiner

*Primary Examiner* — Calvin Lee  
(74) *Attorney, Agent, or Firm* — Oblon, McClelland, Maier & Neustadt, L.L.P.

(57) ABSTRACT

A solid state imaging device according to an embodiment includes a photo detector arranged two-dimensionally in a semiconductor substrate, a readout circuit provided in the semiconductor substrate, a first photoelectric conversion layer provided above the photo detector, a plurality of first metal dots provided above the first photoelectric conversion layer, a second photoelectric conversion layer provided above the first metal dots, and a plurality of second metal dots provided above the second photoelectric conversion layer.

8 Claims, 18 Drawing Sheets

A-A CROSS-SECTION

A-A CROSS-SECTION

IMAGING DEVICE

CROSS REFERENCE TO RELATED APPLICATIONS

This application is based upon and claims the benefit of priority from prior Japanese Patent Application No. 2012-252518 filed on Nov. 16, 2012 in Japan, the entire contents of which are incorporated herein by reference.

FIELD

Embodiments described herein relate generally to solid state imaging devices.

BACKGROUND

Recently, as mobile terminals prevail, become digitized, and have greater storage capacity, the demand for small and high-definition image sensors increases. In order to satisfy such a demand, it is indispensable to decrease the pixel pitch of image sensors. In the currently mainstream CMOS image sensor (hereinafter also referred to as "CMOS sensor"), the pixel size has been reduced to a 1.1 µm×1.1 µm low-pitch.

The pixel used in the aforementioned CMOS sensor is formed of a photodiode serving as a photoelectric conversion unit and a transistor serving as a readout circuit. The area occupied by the transistor serving as the readout circuit cannot be reduced below a certain ratio, even if the design rule is scaled down and the sharing of elements by adjacent pixels is advanced. At present, the ratio of the photoelectric conversion unit in a pixel (aperture rate) is said to be about 50%. That is, the reduction in pixel pitch would lead to the reduction of the area of the photodiode serving as a photoelectric conversion unit, thereby causing a problem of lowering the sensitivity of the sensor.

Recently, CMOS sensors outputting color images are widely used even in small mobile terminals. Generally, in a color CMOS sensor, one of the color filters transmitting any of red (R), green (G), and blue (B) wavelength bands is arranged on each pixel, so that a different pixel measures the light amount in each wavelength to obtain color information. Since a color filter absorbs light in wavelength bands other than the wavelength band of the color to be detected, about two-thirds of the entire light is discarded. In addition, generally, a color filter has a transmittance of about 80%. In consideration of the above, the degradation in sensitivity due to the color filters is also a problem.

In such a color filtering method, where only information for one of the colors R, G, and B can be obtained in one pixel, it is necessary to collect color information from adjacent pixels to perform a demosaicing process. For example, in a Bayer array, slight subject color variations close to the resolution of one pixel cause a defective mode called "false color" where incorrect color information is reproduced. Particularly, for the R and B filters for performing diagonal interpolation, it is only possible to obtain the spatial resolution √2 times the pixel pitch.

A known technique which focuses on the aforementioned point employs three stacked photoelectric conversion layers, with Ag dots with different pitch and width embedded in the respective photoelectric conversion layers. Sensitivity is improved and wavelength selectability is ensured using the plasmon resonant light between the incident light and the Ag dots.

However, several issues remain: the process of embedding metal dots in photoelectric conversion layers is complicated; defects taking place during the process of embedding cause an increase of dark current; and three-layer stack structure requires an improvement in sensitivity.

DETAILED DESCRIPTION

Figure 1:
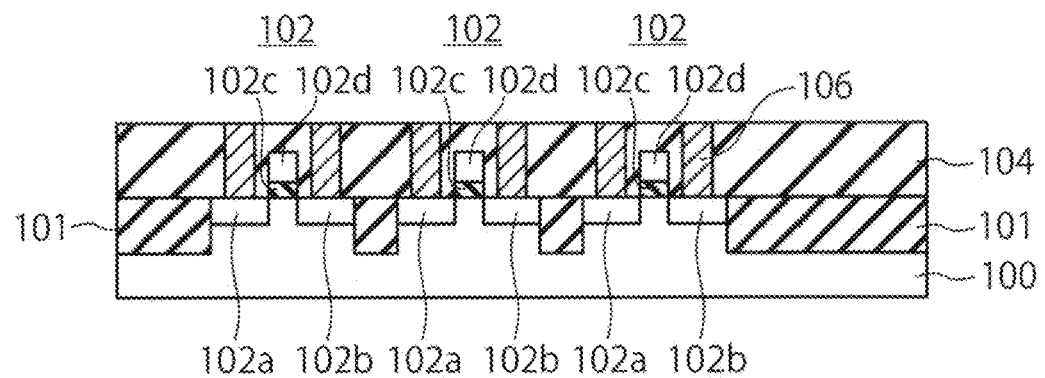
FIG. 1 is a cross-sectional view showing a process of manufacturing a solid state imaging device according to a first embodiment.

A solid state imaging device according to an embodiment includes a photo detector arranged two-dimensionally in a semiconductor substrate, a readout circuit provided in the semiconductor substrate, a first photoelectric conversion layer provided above the photo detector, a plurality of first metal dots provided above the first photoelectric conversion layer, a second photoelectric conversion layer provided above the first metal dots, and a plurality of second metal dots provided above the second photoelectric conversion layer.

Embodiments will now be explained with reference to the accompanying drawings.

First Embodiment

FIGS. 1 to 14 show a method of manufacturing a solid state imaging device according to a first embodiment. In FIGS. 1 to 14, the same reference numeral is assigned to the same portion or the same element, and the explanation thereof is not repeated. Thus, different reference numerals are assigned to only different portions or different elements.

The solid state imaging device according to the first embodiment is manufactured in the following manner. As shown in FIG. 1, a plurality of element isolation regions 101, which are spaced from each other, are formed in a single crystal silicon substrate 100. As a result, an element region that is sandwiched between adjacent element isolation regions 101 is formed. In such an element region, in-pixel transistors 102 are formed by using a general LSI manufacturing process. Each in-pixel transistor 102 includes a source region 102a and a drain region 102b, which are formed in the element region at a distance from each other, a gate insulating film 102c formed on the element region between the source region 102a and the drain region 102b, which region serves as a channel, and a gate electrode 102d formed on the gate insulating film 102c. An interlayer insulating film 104 is formed to cover the in-pixel transistors 102. Subsequently, openings connecting to the source region 102a and the drain region 102b of the in-pixel transistor 102 are formed in the interlayer insulating film 104, and filled with a conductive material, for example tungsten, to form contacts 106.

Figure 2:
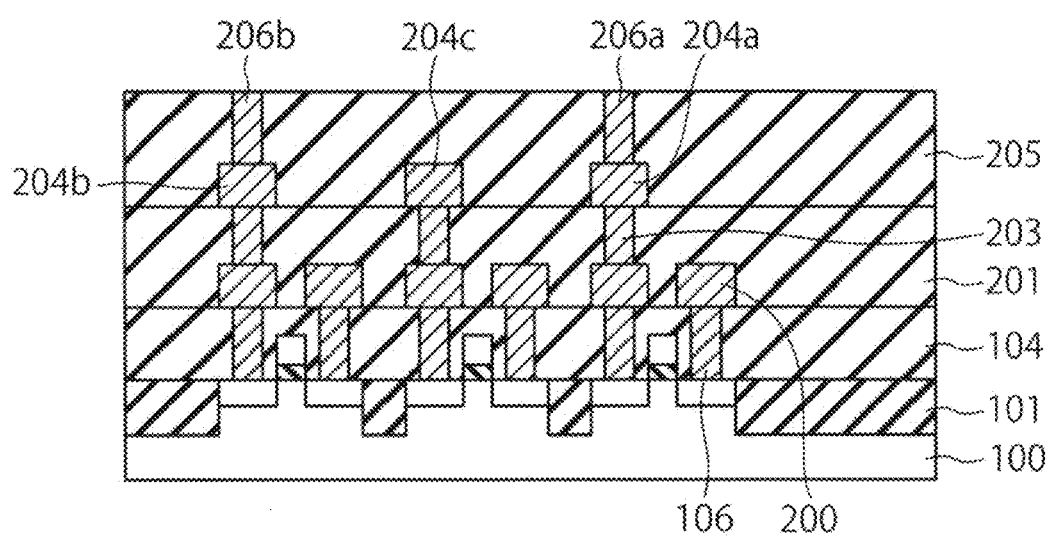
FIG. 2 is a cross-sectional view showing the process of manufacturing the solid state imaging device according to the first embodiment.

Next, as shown in FIG. 2, wirings 200 each connecting to a contact 106 are formed on the interlayer insulating film 104 using a general LSI manufacturing process. An interlayer insulating film 201 is formed to cover the wirings 200. Then, openings connecting to the wirings 200 are formed in the interlayer insulating film 201, and filled with a conductive material, for example tungsten, thereby forming contacts 203. Thereafter, wirings 204a, 204b, 204 respectively connecting to the contacts 203 are formed on the interlayer insulating film 201. An interlayer insulating film 205 is formed to cover the wirings 204a, 204b, 204c. Next, openings connecting to the wirings 204a, 204b are formed in the interlayer insulating film 205, and filled with a conductive material to form contacts 206a, 206b. In FIG. 2, the contact 206a is electrically connecting to the source region 102a of the rightmost transistor 102, and the contact 206b is electrically connecting to the source region 102a of the leftmost transistor 102. In the pixel region, the wirings 200, the contacts 203, the wirings 204a, 204b, 204c, and the contacts 206a, 206b shown in FIG. 2 are mainly used to form a signal reading circuit mainly by the connection between the in-pixel transistors 102.

Figure 3:
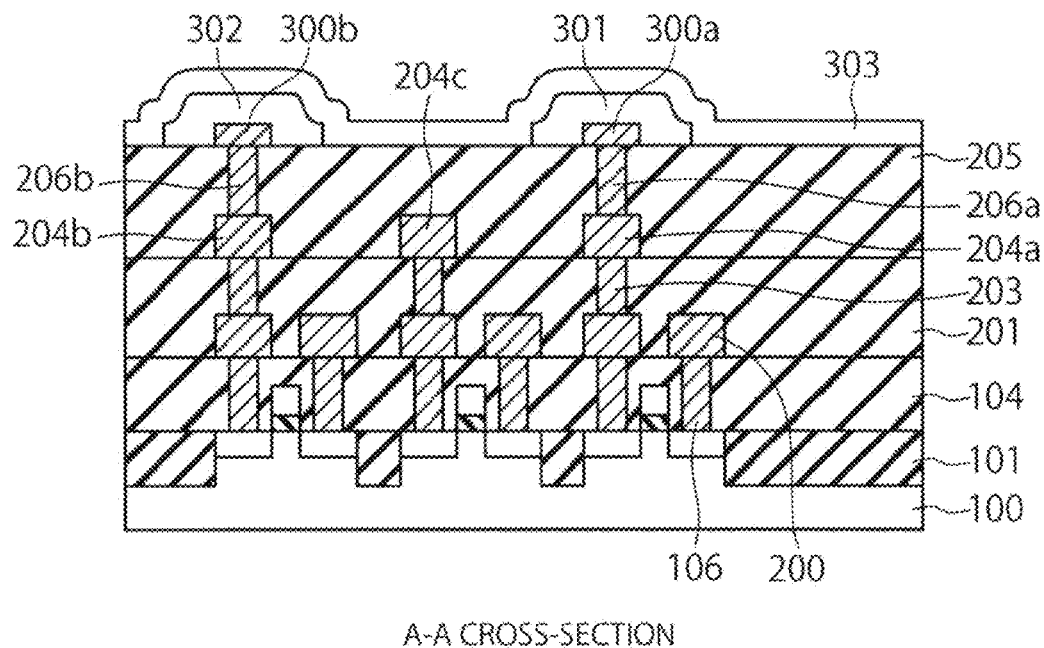
FIG. 3 is a cross-sectional view showing the process of manufacturing the solid state imaging device according to the first embodiment.
Figure 4:
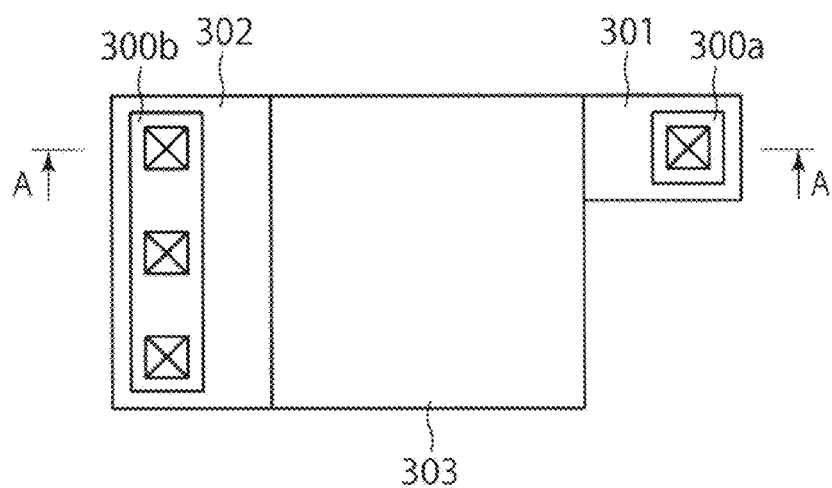
FIG. 4 is a top view showing the process of manufacturing the solid state imaging device according to the first embodiment.

Next, as shown in FIG. 3, in the pixel region, wirings 300a, 300b respectively connecting to the two contacts 206a, 206b are formed on the interlayer insulating film 205. Then, n-type hydrogenated a-SiC (amorphous silicon carbide) 301 is deposited to have a thickness of 50 nm in order to cover the wiring 300a using CVD (Chemical Vapor Deposition), and patterned by a photolithography and etching process. The a-SiC 301 will serve as an n-type contact of a photoelectric conversion layer 303, which will be described later. Subsequently, intrinsic hydrogenated a-SiC 302 is deposited to have a thickness of 50 nm in order to cover the wiring 300b using CVD, and patterned by a photolithography and etching process. The a-SiC 302 will serve as a p-type contact of the photoelectric conversion layer 303, which will be described later. Then, a photoelectric conversion layer 303 is formed to cover the n-type hydrogenated a-SiC 301 and the intrinsic hydrogenated a-SiC 302. The photoelectric conversion layer 303 is formed by depositing hydrogenated intrinsic a-Si layer by CVD, the hydrogenated intrinsic a-Si layer having a thickness of 50 nm. FIG. 4 shows the top view in this state. Incidentally, FIG. 3 is a cross-sectional view taken along the line A-A shown in FIG. 4. The photoelectric conversion layer 303 senses light in the red wavelength band. The n-type hydrogenated a-SiC 301 and the intrinsic hydrogenated a-SiC 302 apply a potential difference to the photoelectric conversion layer 303, so that when an incident light is photoelectrically converted by the photoelectric conversion layer 303, electrons are drifted to the n-type hydrogenated a-SiC 301, and holes are drifted to the intrinsic hydrogenated a-SiC 302.

Figure 5:
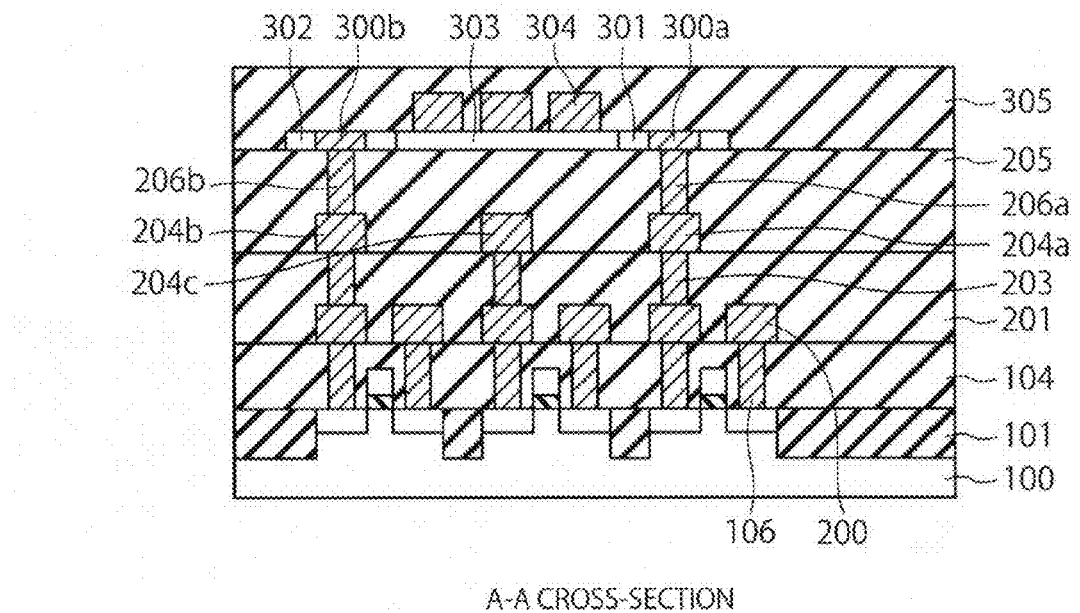
FIG. 5 is a cross-sectional view showing the process of manufacturing the solid state imaging device according to the first embodiment.
Figure 6:
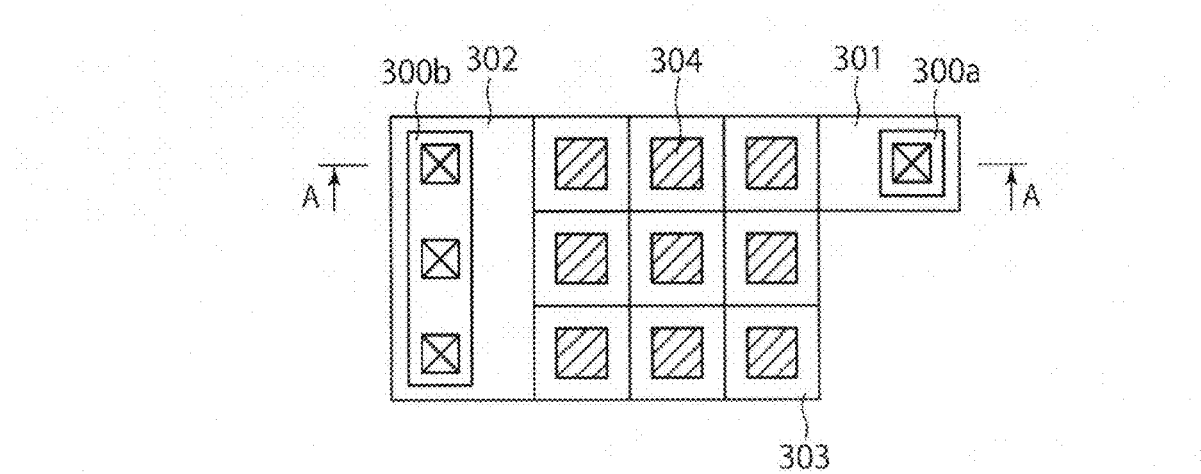
FIG. 6 is a top view showing the process of manufacturing the solid state imaging device according to the first embodiment.

Next, as shown in FIG. 5, the photoelectric conversion layer 303 is flattened using CMP (Chemical Mechanical Polishing) until the top surfaces of the wiring layers 300a, 300b are exposed. Then, a metal, for example Al, is deposited to have a thickness of 100 nm by sputtering, to form square Al dots 304 each with a width of 308 nm on the photoelectric conversion layer 303 by a photolithography and etching process, square Al dots 304 having a pitch of 616 nm. FIG. 6 shows a top view in this state. Incidentally, FIG. 5 is a cross-sectional view taken along line A-A in FIG. 6. In this embodiment, as shown in FIG. 6, nine Al dots 304 are arranged per pixel. However, the number is not limited to nine, and any plural number is allowable as long as resonance occurs. Generally, the thickness of the Al dots 304 influences the peak intensity and the dispersion of plasmon resonance light, and the transmittance of light toward an underneath layer. In this embodiment, because of the design of the photoelectric conversion layer 303 that will be described later, it is determined that the thickness should 100 nm in consideration of the optimization of the stacked structure. However, the thickness of the Al dots 304 is not limited to 100 nm since the parameters may differ depending on the spectral sensitivity characteristics to be obtained. Subsequently, an oxide film 305 is deposited by CVD to have a thickness of 200 nm, and flattened by CMP so that a 4 nm-thick oxide film 305 is left on the Al dots 304. It is preferable that the thickness of the oxide film 305 to be left on the Al dots 304 is from 2 nm to 10 nm. In this manner, a resonance light in the green wavelength band, in which the plasmon resonance wavelength is shifted by about 100 nm to the lower wavelength side, is emitted upward from the Al dots 304. As a result, the photoelectric conversion layer 303 is formed, which uses the plasmon resonance between the Al dots 304 and the incident light in the red wavelength band.

Figure 7:
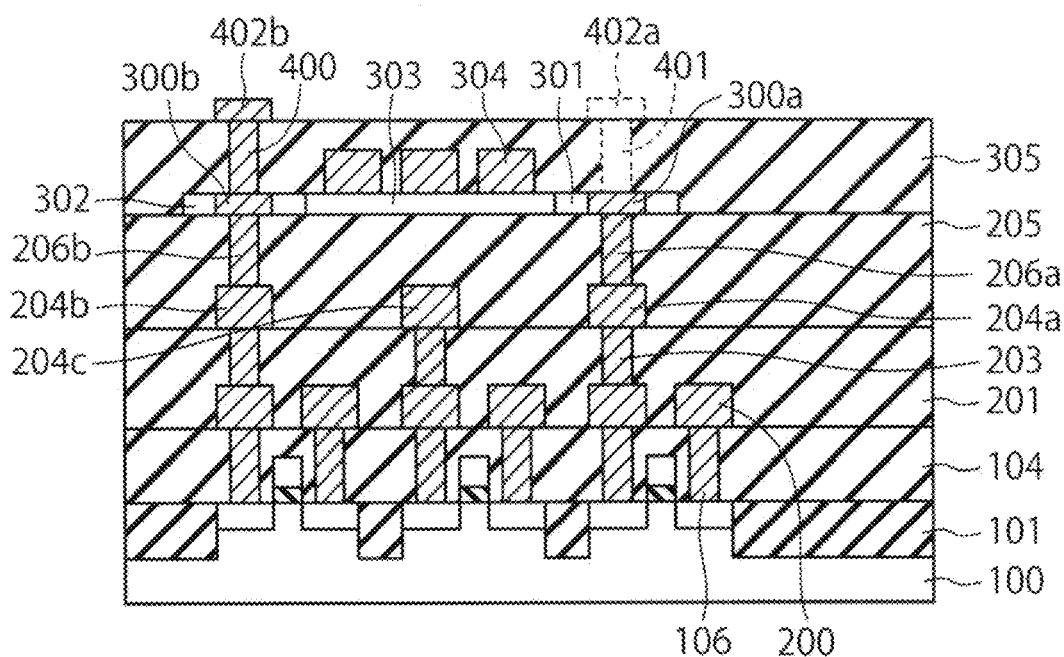
FIG. 7 is a cross-sectional view showing the process of manufacturing the solid state imaging device according to the first embodiment.
Figure 8:
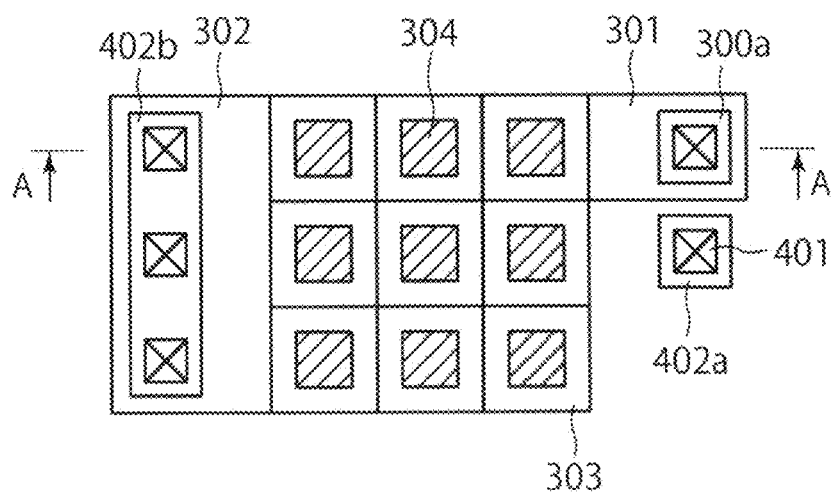
FIG. 8 is a top view showing the process of manufacturing the solid state imaging device according to the first embodiment.

Next, as shown in FIG. 7, openings are formed in the oxide film 305, and are filled with a conductive material, for example tungsten, to form a contact 400 and a contact 401. FIG. 8 shows a top view in this state. Incidentally, FIG. 7 is a cross-sectional view taken along the line A-A in FIG. 8. The contact 400 is a common p-type contact, and the contact 401 is for electrically connecting the in-pixel transistor 102 and a photoelectric conversion layer 405 for sensing light in the green wavelength band, which will be described later. Then, wiring layers 402a and 402b connecting to the contacts 400 and 401 are formed.

Figure 9:
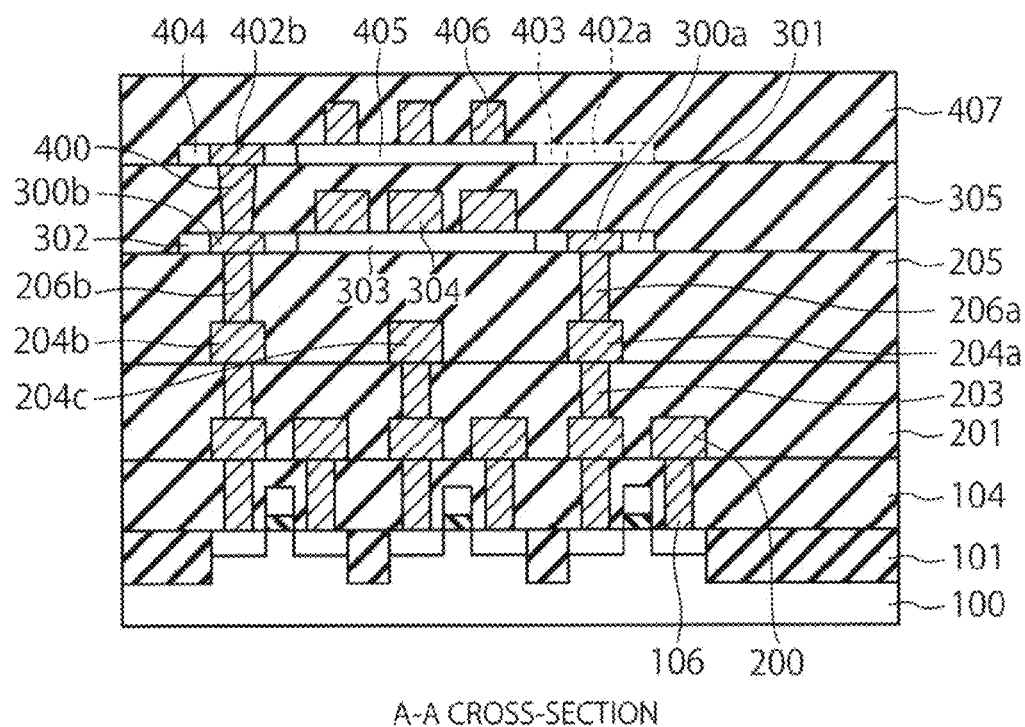
FIG. 9 is a cross-sectional view showing the process of manufacturing the solid state imaging device according to the first embodiment.
Figure 10:
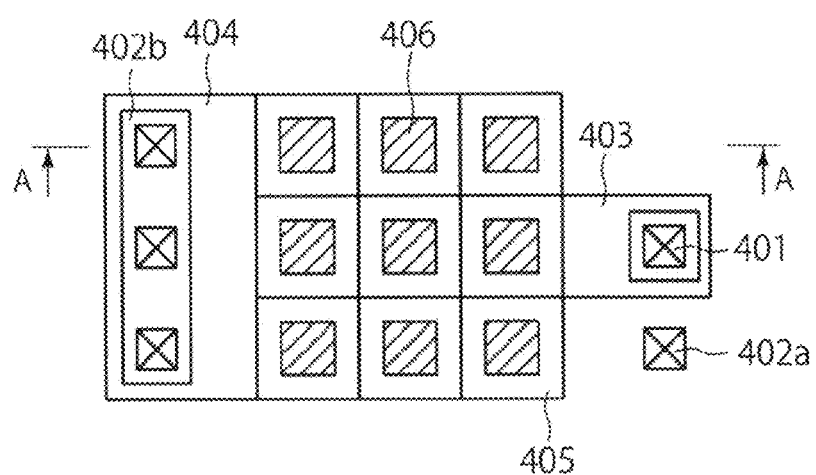
FIG. 10 is a top view showing the process of manufacturing the solid state imaging device according to the first embodiment.

Subsequently, as shown in FIG. 9, n-type hydrogenated a-SiC 403 is deposited to have a thickness of 50 nm by CVD in order to cover the wiring 402a, in the same manner as described in the descriptions of FIG. 3 and FIG. 5. The n-type hydrogenated a-SiC 403 are patterned using a photolithography and etching process. The a-SiC 403 will serve as an n-type contact of the photoelectric conversion layer 405, which will be described later. Then, intrinsic hydrogenated a-SiC 404 is deposited to have a thickness of 50 nm by CVD in order to cover the wiring 300b. The intrinsic hydrogenated a-SiC 404 is patterned by using a photolithography and etching process. The a-SiC 404 will serve as a p-type contact of the photoelectric conversion layer 405, which will be described later. Thereafter, the photoelectric conversion layer 405 is formed to cover the n-type hydrogenated a-SiC 403 and the intrinsic hydrogenated a-SiC 404. The photoelectric conversion layer 405 is formed by depositing a hydrogenated intrinsic a-Si layer having a thickness of 50 nm by CVD. Subsequently, Al is deposited to have a thickness of 100 nm by sputtering, and square Al dots 406 each having a width of 257 nm are formed with a 616-nm pitch by a photolithography and etching process on the photoelectric conversion layer 405. FIG. 10 shows a top view in this state. Incidentally, FIG. 9 is a cross-sectional view taken along the line A-A in FIG. 10. Thereafter, an oxide film 407 having a thickness of 200 nm is deposited by CVD, and flattened by CMP so that the oxide film 407 having a thickness of 4 nm is left on the Al dots 406. It is preferable that the thickness of the oxide film 407 left on the Al dots 406 is in the range of 2 nm to 10 nm. In this manner, a resonance light in the blue wavelength band, in which the plasmon resonance wavelength is shifted by about 100 nm toward the lower wavelength side is emitted upward from the Al dots 406. As a result, the photoelectric conversion layer 405 using the plasmon resonance between the Al dots 406 and the incident light in the green wavelength band is formed.

Figure 11:
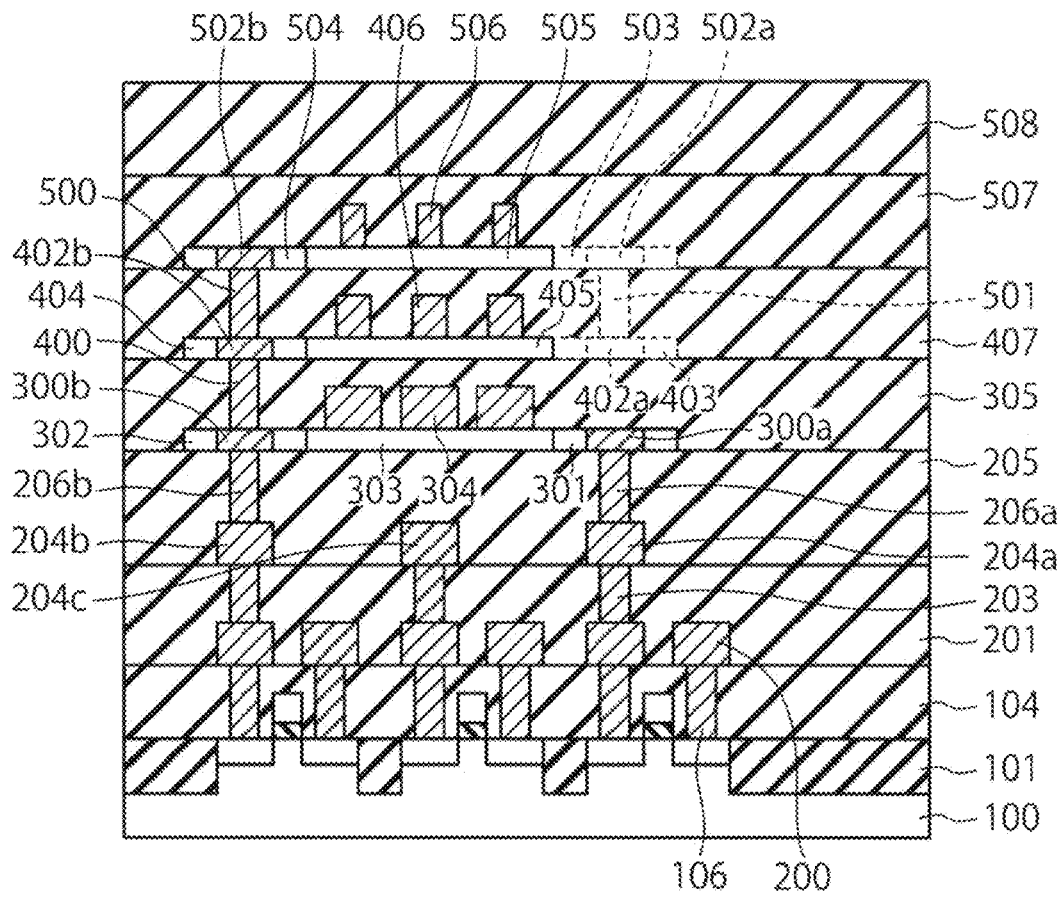
FIG. 11 is a cross-sectional view showing the process of manufacturing the solid state imaging device according to the first embodiment.

Next, as shown in FIG. 11, in the same manner as has been described by referring to FIGS. 7 and 9, openings are formed in the oxide film 407, and filled with, for example, tungsten to form a contact 500 and a contact 501. The contact 500 is a common p-type contact, and the contact 501 is for electrically connecting the in-pixel transistor 102 and a photoelectric conversion layer 505 for sensing light in the blue wavelength band, which will be described later. Then, wiring 502a and 502b connecting to the contacts 500 and 501 are formed.

Subsequently, n-type hydrogenated a-SiC 503 is deposited to have a thickness of 50 nm by CVD, so as to cover the wiring 502a, and patterned using a photolithography and etching process. The a-SiC 503 serve as an n-type contact of a photoelectric conversion layer 505, which will be described later. Thereafter, intrinsic hydrogenated a-SiC 504 is deposited to have a thickness of 50 nm by CVD so as to cover the wiring 502b, and patterned by a photolithography and etching process. The a-SiC 504 will serve as a p-type contact of the photoelectric conversion layer 505, which will be described later. Then, the photoelectric conversion layer 505 is formed to cover the n-type hydrogenated a-SiC 503 and the intrinsic hydrogenated a-SiC 504. The photoelectric conversion layer 505 is formed by depositing a hydrogenated intrinsic a-Si layer having a thickness of 50 nm by CVD. Thereafter, Al is deposited to have a thickness of 100 nm by sputtering in order to form square Al dots 506, each having a width of 213 nm, in a 616-nm pitch by a photolithography and etching process on the photoelectric conversion layer 505. Then, an oxide film 507 having a thickness of 300 nm is deposited by CVD, and flattened by CMP. As a result, the photoelectric conversion layer 505 using the plasmon resonance between the Al dots 506 and the incident light in the blue wavelength band is formed. Thereafter, SiN is deposited by CVD to have a thickness of 300 nm on the oxide film 507, the SiN serving as a passivation layer 508, and a sintering process is performed.

Figure 12:
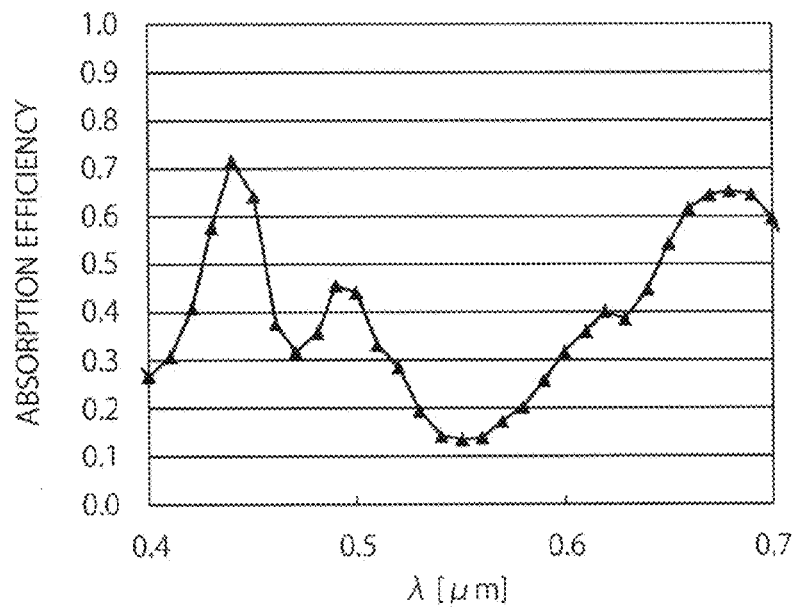
FIG. 12 is a drawing showing an absorption characteristic of the solid state imaging device according to the first embodiment.

FIG. 12 shows a spectral characteristic of the light absorption efficiency of the obtained device. From FIG. 12, it could be understood that although the thicknesses of the photoelectric conversion layers for the colors R, G, B are very thin, it is possible to obtain sufficient absorption efficiency and wavelength selectivity by using plasmon resonance.

Generally, when a photoelectric conversion layer is formed to have a stacked structure, the light transmittance to a lower layer is lost due to the absorption, reflection, etc. in an upper layer. In order to deal with this problem, in this embodiment, the following structure is employed for avoiding the decrease in absorption efficiency in the red wavelength band of the lowermost layer.

Figure 13:
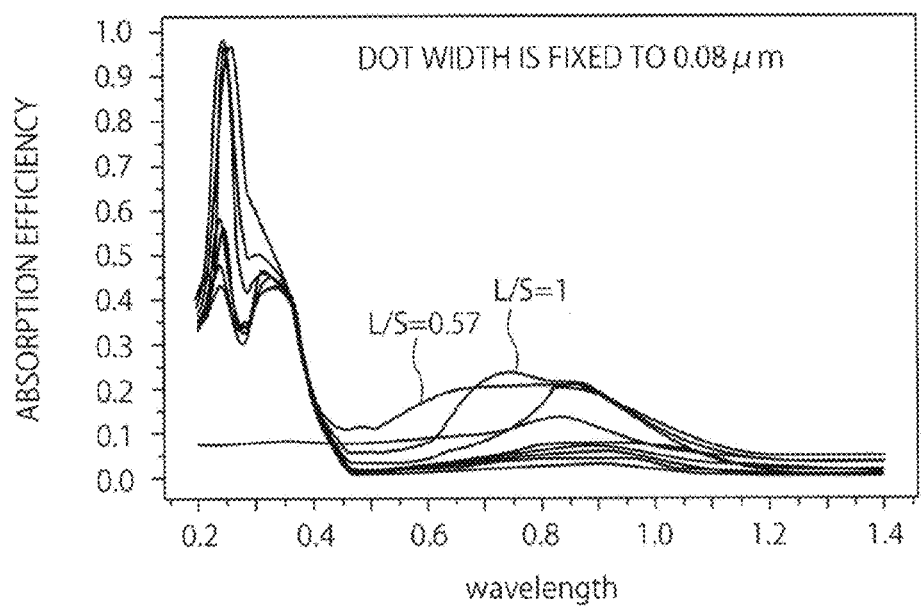
FIG. 13 is a drawing showing an absorption characteristic of the solid state imaging device according to the first embodiment.

In this embodiment, the Al dot pitch (=616 nm) is twice the width, 308 nm, of the Al dot 304 in the red wavelength band. This is determined based on the result of the simulation shown in FIG. 13. FIG. 13 is a drawing showing the dependency of the absorption efficiency on the wavelength in the case where in a single layer structure including Al dots and silicon, the Al dot width (L) is fixed, and the space (S) is varied. From FIG. 13, it can be understood that the plasmon resonance peak intensity and the ratio L/S representing the shape are optimum in the range from 0.57 to 1.0. Based on this, in this embodiment, the structure of the red wavelength band, which is estimated to have the lowest transmittance intensity, is designed.

Figure 14:
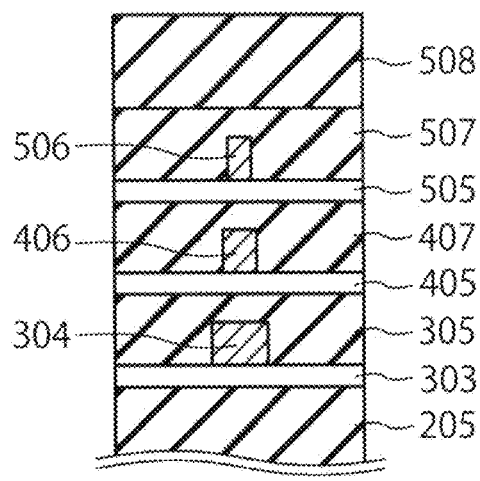
FIG. 14 is a cross-sectional view showing a part of the solid state imaging device according to the first embodiment.
Figure 15:
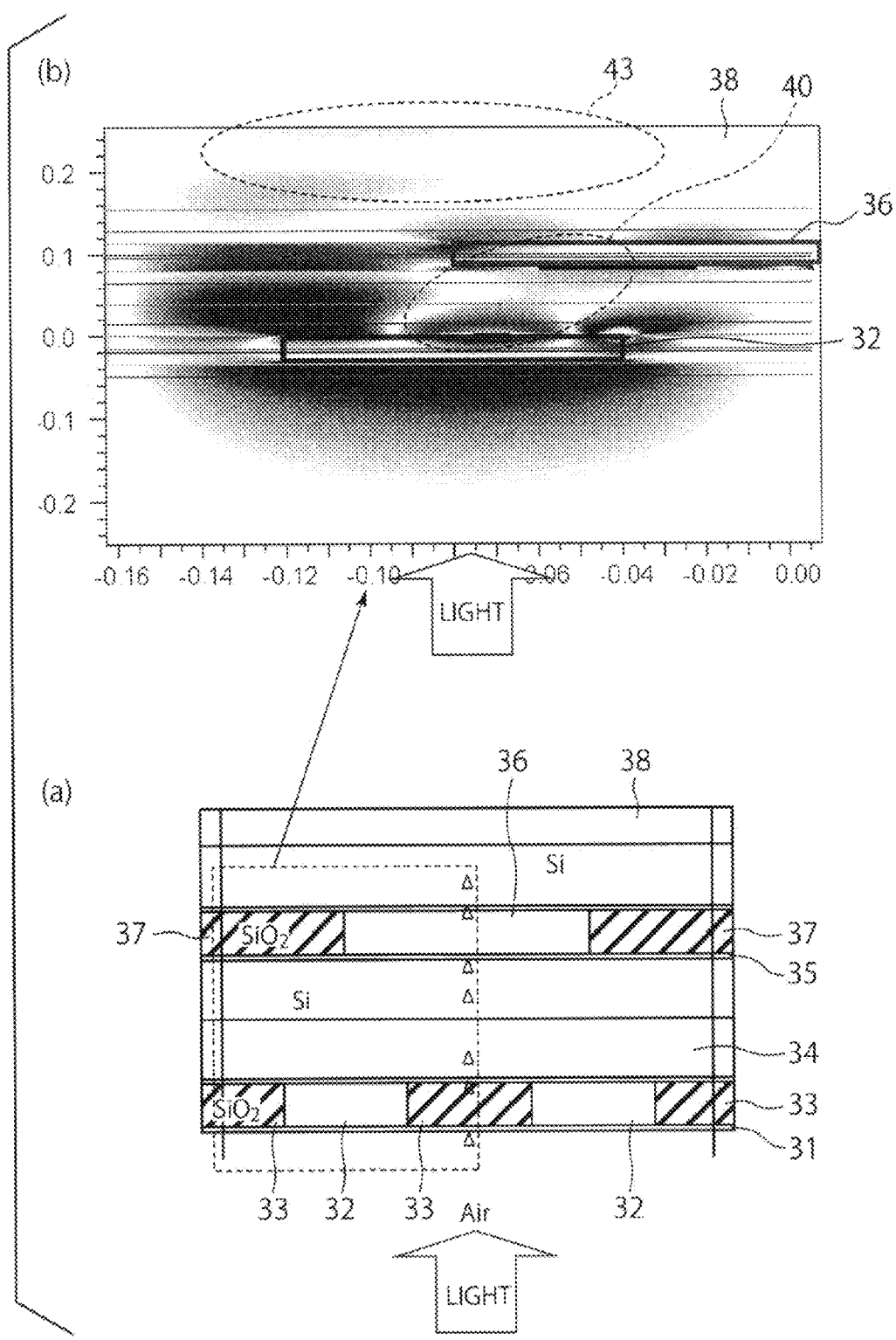
FIGS. 15(a) and 15(b) are drawings showing an example of the arrangement of metal dots in a multi-layer structure.

As shown in FIG. 14, the solid state imaging device according to this embodiment has a tree-shape structure in which the space of upper layer is increased. In this structure, the peripheral portions and the corner portions of the pattern, in which the plasmon resonance is strong, are arranged so as to exposed to the direction in which light is incident. In this manner, a plasmon resonance light that is strongly dependent on the Al dot width and pitch is generated, thereby improving the controllability of the resonance peak position based on the Al dot width and pitch. Furthermore, since the space for Al dots is increased for upper layers, it is possible to secure the light transmittance toward lower layers. These effects can be confirmed from the results of electric field intensity simulation shown in FIG. 15(a) to FIG. 16(b). FIG. 15(a) is a cross sectional view showing a model structure used in a FDTD (Finite-Difference Time-Domain) simulation of two-layer-stacked inverted tree structure, in which the Al dot occupancy is fixed. FIG. 15(b) is a drawing showing the simulation result in the area surrounded by the broken line in FIG. 15(a). FIG.

Figure 16:
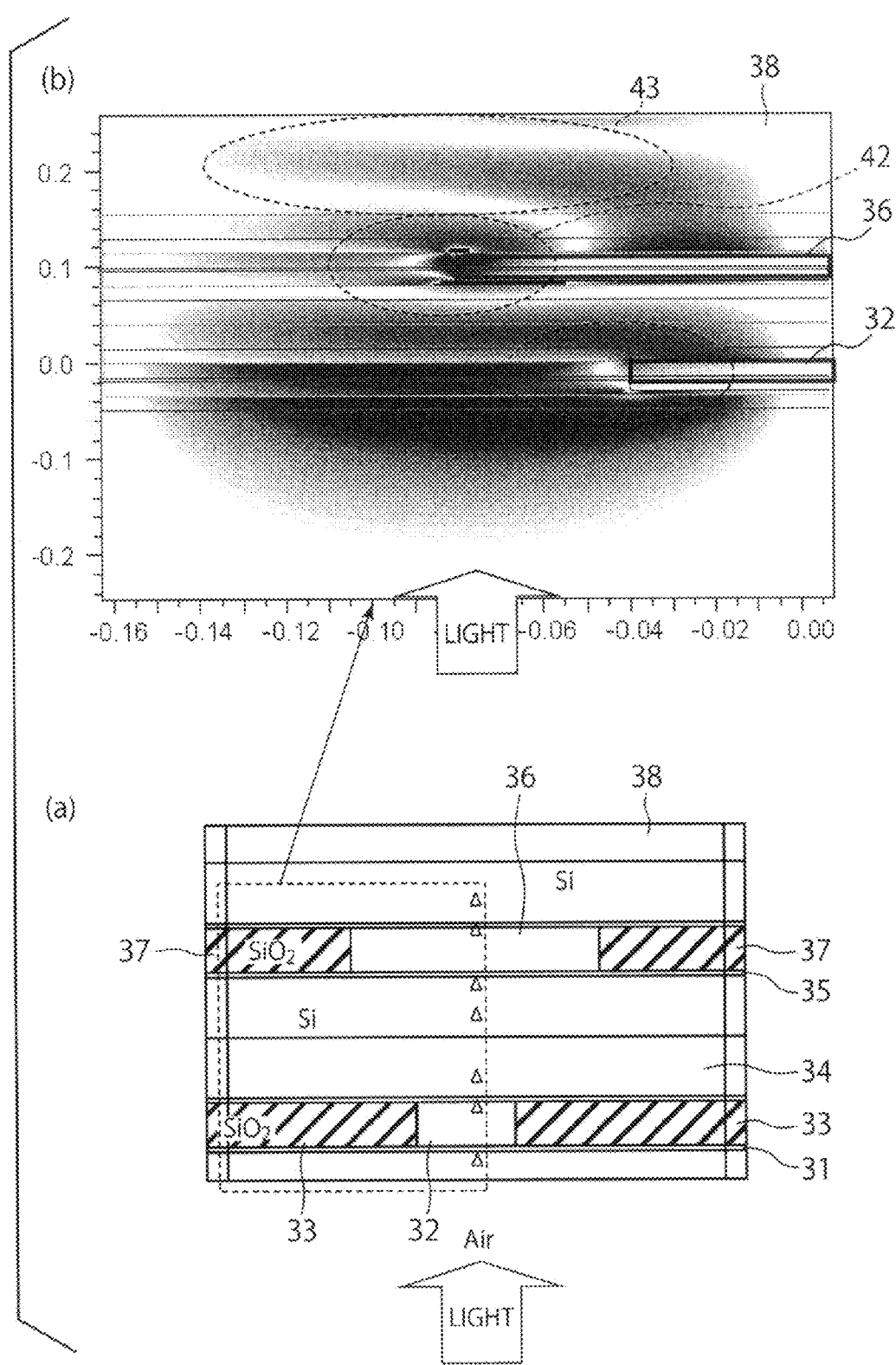
FIGS. 16(a) and 16(b) are diagrams showing an example of the arrangement of metal dots in a multi-layer structure of the embodiment.

16(a) is a cross-sectional view showing a model structure used in a FDTD (Finite-Difference Time-Domain) simulation of two-layer-stacked tree structure, in which the Al dot occupancy in the upper layer is fixed. FIG. 16(b) is a drawing showing the simulation result in the area surrounded by the broken line in FIG. 16(a). In FIGS. 15(a) and 16(a), in the lower Al dot layer formed in the Si layer, Al dots 32 are separated by SiO$_2$ 33, each Al dot 32 having a thickness d of 30 nm and the width w of 80 nm. In the upper Al dot layer, Al dots 36 are separated by SiO$_2$ 37, each Al dot 36 having a thickness d of 30 nm and the width w of 160 nm. A Si layer 34 is provided between the lower Al dot layer and the upper Al dot layer, and a Si layer 38 is provided onto the upper Al dot layer. Moreover, SiO$_2$ 31 is provided under the lower Al dots 32 so as to have a thickness of 4 nm, and SiO$_2$ 35 is provided under the upper Al dots 36 so as to have a thickness of 4 nm. As shown FIGS. 15(a) to 16(b), light is incident from the lower surface. Thus, in FIGS. 15(a) to 16(b), the up and down directions are opposite to those of the solid state imaging device according to the first embodiment shown in FIGS. 1 to 14.

As a result of the comparison between these cases, it is expected that in the inverted tree structure shown in FIGS. 15(a) and 15(b), there would be a portion 40, in which a strong electric field coupling is caused, as shown by a broken line between the central portion in the upper surface of the lower Al dots 32 and a portion slightly to the periphery of the upper surface of the upper Al dots 36, and the resonance mode between the metals of the hierarchical structure would influence the characteristics. In contrast, in the tree structure shown in FIGS. 16(a) and 16(b), there is mainly a portion 42 shown by the broken line in the electric field coupling mode starting from the end portions of the Al dots 32 and 36, and there is mainly an influence of metal width and pitch. Furthermore, it can be understood that the electric field transmitted to the upper portion (portion 43 surrounded by the broken line) is stronger in the tree structure shown in FIG. 16(a), 16(b) than that in the two-layer-stacked inverted tree structure shown in FIGS. 15(a) and 15(b). In this embodiment, the tree structure shown in FIGS. 16(a) and 16(b) is employed.

First Modification

Figure 17:
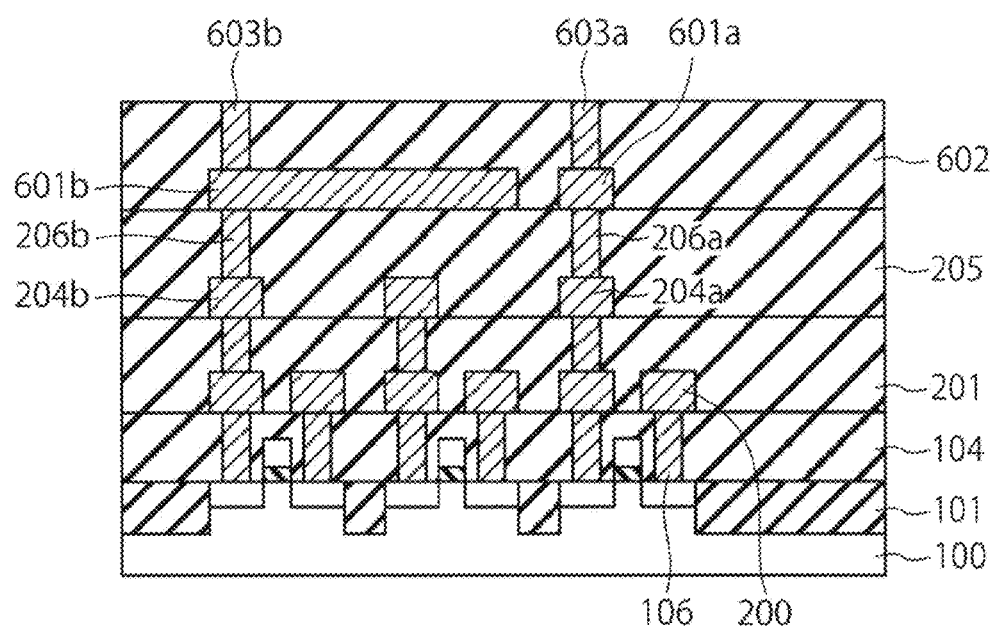
FIG. 17 is a cross-sectional view showing a process of manufacturing a solid state imaging device according to a first modification of the first embodiment.

In the first embodiment, after the step shown in FIG. 2 is completed, a further layer is added as shown in FIG. 17. The layer to be added is formed in the following manner. Wiring 601a and 601b, which are located below the photoelectric conversion layer 303 shown in FIG. 5, are formed on the interlayer insulating film 205 so as to cover the photoelectric conversion layer 303 when viewed from the substrate 100. The wirings 601a and 601b connect to the contacts 206a and 206b, respectively. Subsequently, an interlayer insulating film 602 is formed to cover the wirings 601a, 601b. Thereafter, openings, which connect to the wirings 601a, 601b, are formed in the interlayer insulating film 602, and filled with a conductive material, for example tungsten, thereby forming contacts 603a, 603b. After this step, it is possible to form thereon a stacked photoelectric conversion portion by the steps having been explained with reference to FIGS. 4 to 11. In this manner, it is possible to improve the light absorption efficiency, in particular to improve the absorption strength of the red wavelength band, the absorption of which requires a thickness of the layer, by reflecting light that has transmitted a thin a-Si layer to serve as a photoelectric conversion layer, etc., and re-absorbing the light by the photoelectric conversion layer stacked above.

Second Modification

Figure 18:
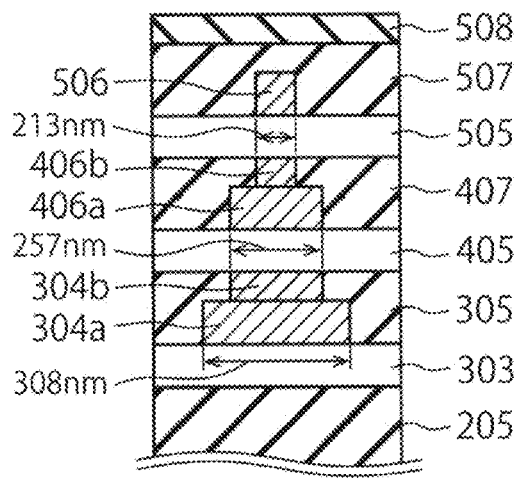
FIG. 18 is a cross-sectional view showing a part of a solid state imaging device according to a second modification of the first embodiment.

In the first embodiment, the bottom of each Al dot is in contact with an a-Si layer, and the top surface of each Al dot is in contact with an insulating layer. By changing the dielectric constant between the dielectric substances in contact with the upper surface and the lower surface of each Al dot, it is possible to improve the light absorption efficiency of the sandwiched light conversion layer using the wavelength shift between the resonance light emitted above and the resonance light emitted below of the Al dots. However, besides this method, as shown in FIG. 18, an Al dot 304 having a stacked structure including Al dots 304a, 304b, and an Al dot 406 having a stacked structure including Al dots 406a, 406b can be formed in a step-like shape by performing a lithography-and-etching process two times for each stacked structure. Unlike the first embodiment, no dielectric constant substance (SiO$_2$) is sandwiched between the Al dot 304 and the Al dot 406, and between the Al dot 406 and the Al dot 506, but these Al dots are directly in contact with a-Si 405, 505. With such a structure of the second modification, it is possible to use the upper and lower emission peak shifts.

Third Modification

Figure 19:
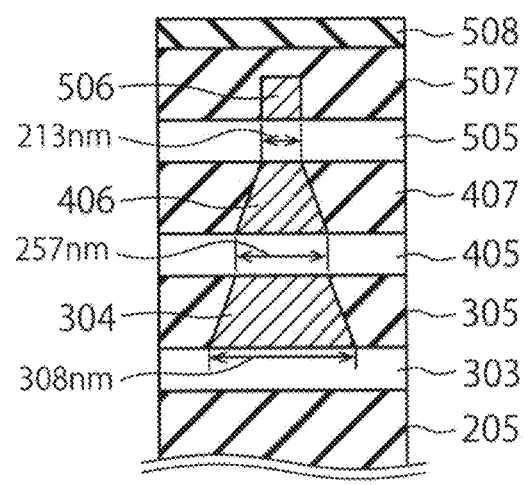
FIG. 19 is a cross-sectional view showing a part of a solid state imaging device according to a third modification of the first embodiment.

As in a third modification shown in FIG. 19, each of the Al dots 304, 406, 506 can be etched in a size-adjusted tapered shape. In this case, the number of masks in the manufacturing procedure can be decreased.

In the first embodiment and its modifications, the light incident onto the solid state imaging device is emitted from the face opposite to the substrate 100. For this reason, as the metal dots are more distant from the substrate 100, their width is decreased. In the case where the light is incident from the substrate 100, it is preferable that the width of the metal dots is increased as they are more distant from the substrate.

The metal for forming the dots is not limited to Al, but can be Ag, Au, Pt, etc. depending on the peak wavelength required.

In this embodiment, hydrogenated intrinsic a-Si is used to form the photoelectric conversion layer. However, a semiconductor layer formed of low-temperature polycrystalline silicon or low-temperature polycrystalline germanium can also be used. Furthermore, depending on the necessity, different semiconductor materials can be used to form the R, G, and B photoelectric conversion layers. For example, optical absorption coefficient is in the order of low-temperature polycrystalline silicon<amorphous silicon<low-temperature polycrystalline germanium. Accordingly, polycrystalline silicon can be used for the blue wavelength band absorption layer, in which the transparency is required, and the absorption is relatively high since the blue wavelength is short wavelength, amorphous silicon can be used for the green wavelength band absorption layer, the wavelength of which is in the middle, and polycrystalline germanium can be used for the lowermost red wavelength band absorption layer, since the absorptivity of polycrystalline germanium is not easily lowered in the long wavelength area.

The width, pitch, and thickness of the Al dots, the thickness of the a-Si layer, and the method of stacking and arranging these elements influence the peak position of the intensity of the plasmon resonance. However, these factors are not limited to those determined in this embodiment, but can be changed depending on the spectral sensitivity characteristics to be obtained.

As described above, according to this embodiment, the metal dots are not embedded in the photoelectric conversion layer. Accordingly, the manufacturing process can be simplified, the increase in dark current can be curbed, and the decrease in sensitivity can also be curbed.

Second Embodiment

A solid state imaging device according to a second embodiment will be described with reference to FIG. 20. The solid state imaging device of the second embodiment is obtained by adding transistors to the stacked photoelectric conversion layer to the first embodiment using the process of forming a TFT (Thin Film Transistor) in order to provide a floating diffusion function for removing reset noise (dark current).

Figure 20:
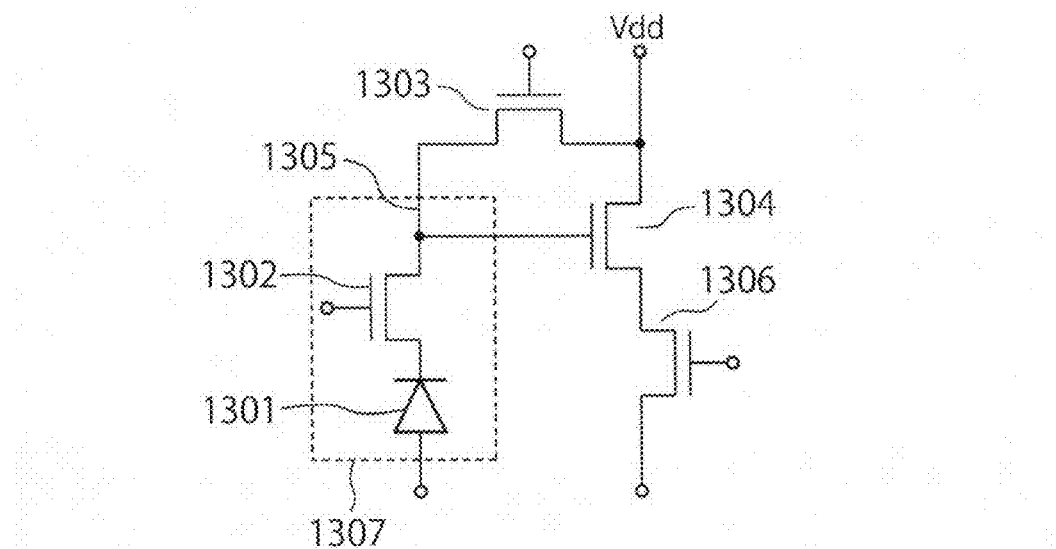
FIG. 20 is a circuit diagram of transistors in a pixel of a CMOS image sensor having a floating diffusion.

FIG. 20 shows a circuit diagram of transistors in a CMOS image sensor pixel having an ordinary floating diffusion.

A cathode electrode of a PIN diode 1301 of a-Si is connected to a drain electrode of a row selection transistor 1302. When the row selection transistor 1302 is turned ON by receiving a row selection signal at its gate, the charge accumulated in dependence on the amount of light incident onto the PIN diode 1301 is injected into the source side of the row selection transistor 1302. The source of the row selection transistor 1302 is connected to the drain of a reset transistor 1303 and the drain of an amplification transistor 1304, and is a region called "floating diffusion 1305" having a slight parasitic capacitance C relating to these connections. The gate voltage of the amplification transistor 1304 is determined by the ratio Q/C of the accumulated charge Q of the PIN diode 1301 to the capacitance. C of the floating diffusion 1305. Thereafter, a column selection transistor 1306 is turned ON when its gate receives a column selection signal, and a pixel output signal is outputted with a gain determined in dependence on the gate voltage of the amplification transistor 1304. Before this readout operation, the reset transistor 1303 is turned ON to fix the floating diffusion 1305 at a reset level, and perform readout operation in a similar manner to record the reset level. Thereafter, the aforementioned signal readout is performed, and a correlated double sampling operation for performing the difference therebetween is performed, thereby enabling the removal of reset noise such as a dark current. In the second embodiment, a region 1307 shown in FIG. 20 is formed in each photoelectric conversion layer.

Figure 21:
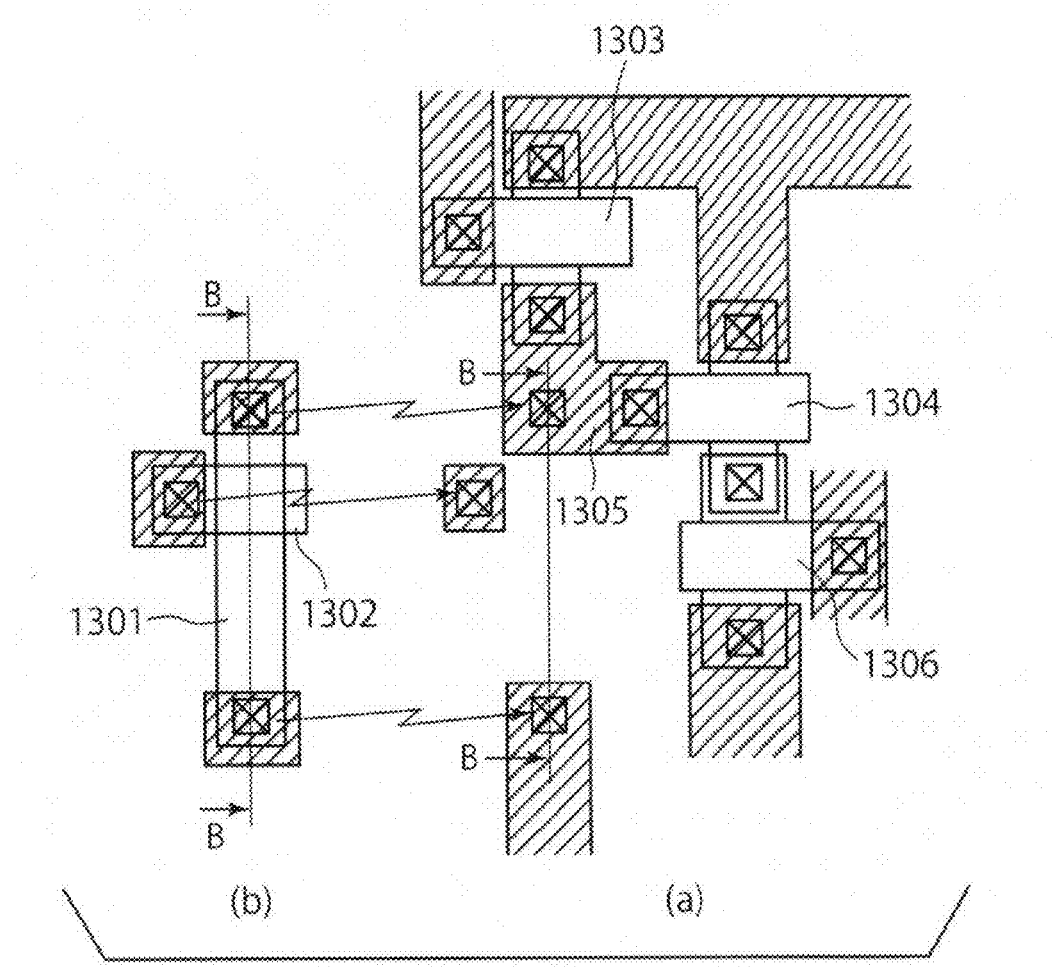
FIGS. 21(a) and 21(b) are plan views showing a solid state imaging device according to a second embodiment.

FIGS. 21(a) and 21(b) show plan views of a solid state imaging device according to the second embodiment. FIG. 21(a) is a plan view viewed from a layer below a photoelectric conversion layer, e.g. from the top surface of the insulating layer 205 shown in FIG. 2. FIG. 21(b) is a drawing viewed from a top surface of a photoelectric conversion layer, e.g., from the top surface of the photoelectric conversion layer 303 shown in FIG. 7. These drawings show that the contacts connected by an arrow overlap when viewed from above.

A process of manufacturing the solid state imaging device according to this embodiment will be described with reference to a cross-sectional view taken along line B-B shown in FIGS. 21(a) and 21(b). The position of the line B-B differs from that of the line A-A shown in FIGS. 2 and 3.

Figure 22:
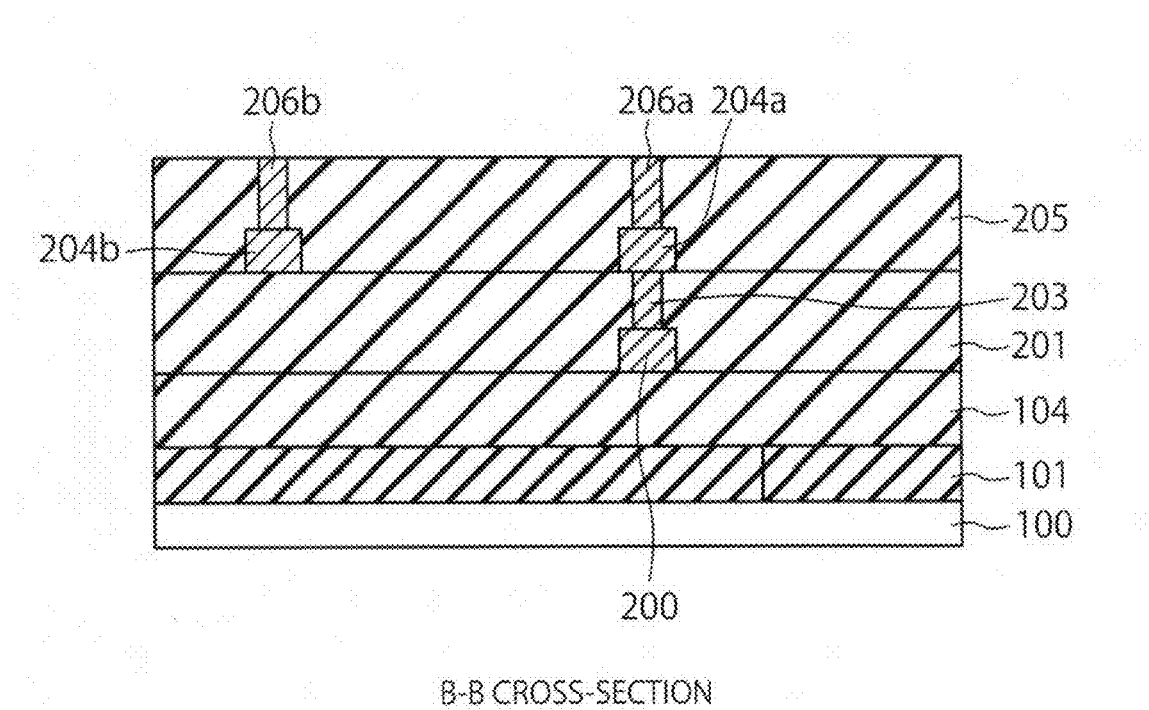
FIG. 22 is a cross-sectional view showing a process of manufacturing the solid state imaging device according to the second embodiment.

As shown in FIG. 22, on a single crystal silicon substrate 100, an element isolation region 101, an interlayer insulating film 104, a wiring layer 200, an interlayer insulating film 201, a contact 203, wiring layers 204a, 204b, an interlayer insulating film 205, and contacts 206a, 206b are formed using an ordinary LSI manufacturing process. The wiring layer 200, the contact 203, the wiring layer 204a, and the contact 206a are a part of the floating diffusion 1305. The wiring 204b and the contact 206b connect to the p-side electrode of the PIN diode 1301 of a-Si, and have a role of dissipating the holes generated by the photoelectric conversion.

Figure 23:
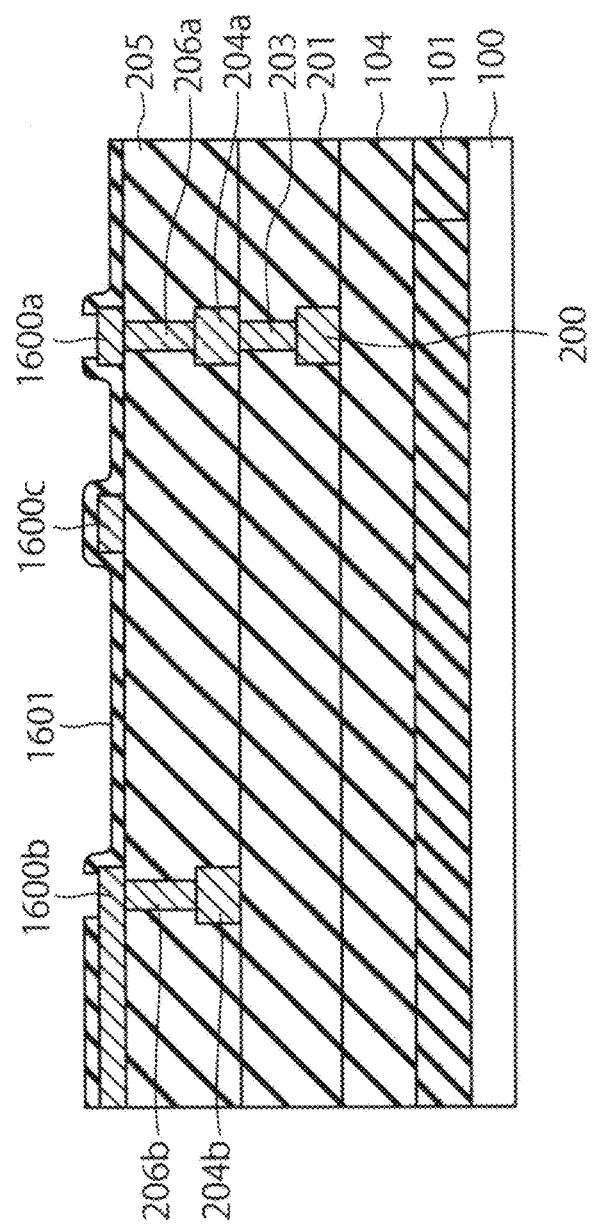
FIG. 23 is a cross-sectional view showing the process of manufacturing the solid state imaging device according to the second embodiment.

Next, as shown in FIG. 23, wiring layers 1600a, 1600b electrically connecting to the photoelectric conversion layer 1604 for detecting light in the red wavelength band are formed. In this embodiment, a wiring layer 1600c is a gate electrode of a TFT. Accordingly, surface-oxidized Al (stacked structure including $Al_2O_3/Al$), Mo (stacked structure including $MoO_3/Mo$), or Ta (stacked structure including $TaO_2/Ta$) may be used to form the wiring layer 1600c. This TFT will serve as the row selection transistor 1302 shown in FIG. 20. Subsequently, a SiN film to serve as a gate oxide film 1601 of the TFT is formed by CVD so as to have a thickness of 100 nm. Then, holes are opened in the wiring layer 1600b to serve as the p-side electrode of the PIN diode 1301 and the wiring layer 1600a to serve as the source electrode of the TFT by a lithography and etching process.

Figure 24:
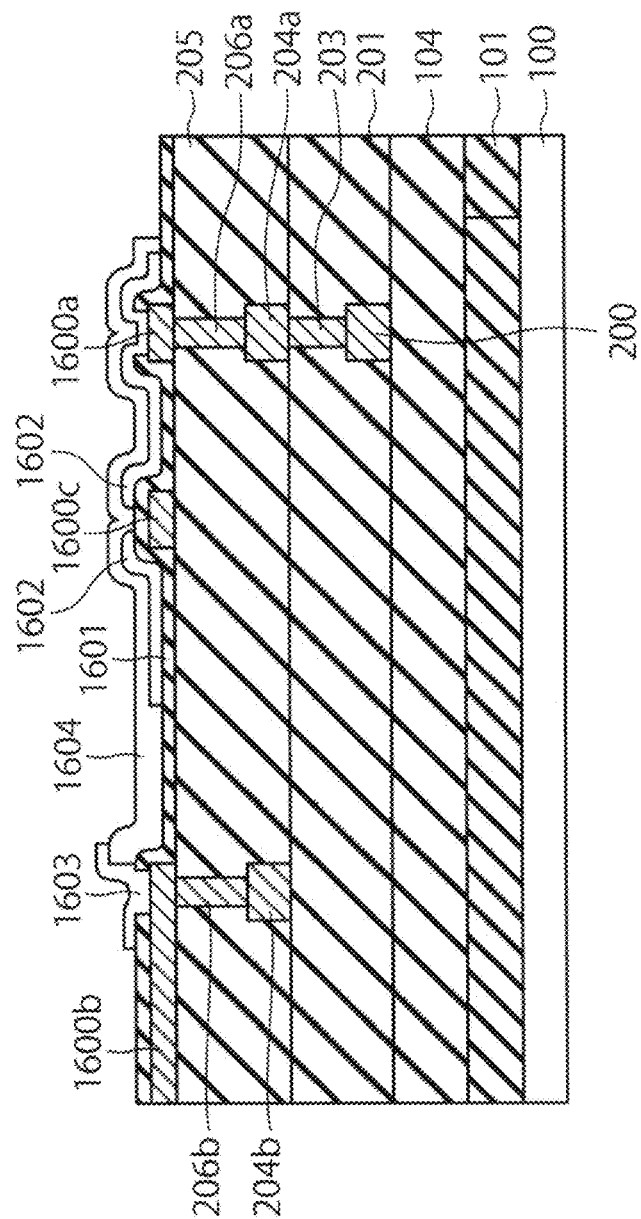
FIG. 24 is a cross-sectional view of the process of manufacturing the solid state imaging device according to the second modification.

Next, as shown in FIG. 24, an n-type hydrogenated a-SiC 1602 to serve as an n-type contact of the photoelectric conversion structure 1604 is formed by CVD so as to have a thickness of 50 nm, and patterned by a photolithography and etching process. Subsequently, an intrinsic hydrogenated a-SiC 1603 to serve as a p-type contact of the photoelectric conversion layer 1604 is formed by CVD so as to have a thickness of 50 nm, and patterned by a photolithography and etching process. Thereafter, a hydrogenated intrinsic a-Si layer to serve as the photoelectric conversion layer 1604 is formed by CVD so as to have a thickness of 50 nm, and patterned by a photolithography and etching process, thereby forming the photoelectric conversion layer 1604.

Figure 25:
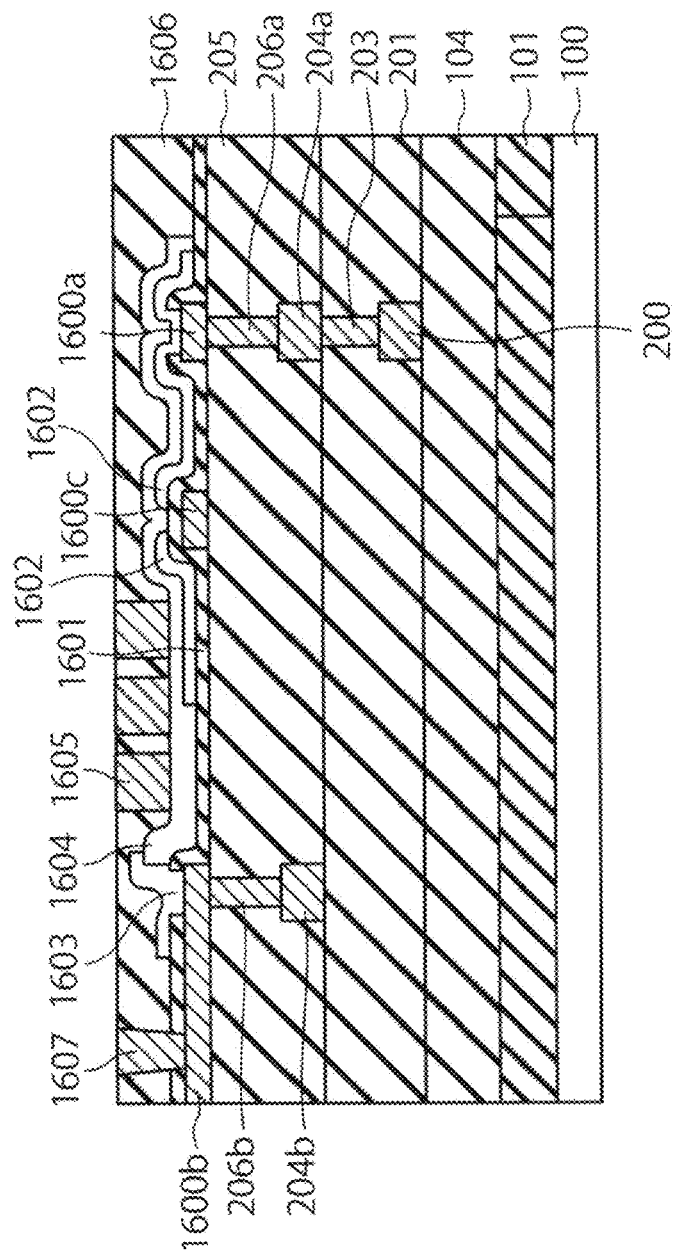
FIG. 25 is a cross-sectional view of the process of manufacturing the solid state imaging device according to the second embodiment.

Then, as shown in FIG. 25, Al is deposited by sputtering so as to have a thickness of 60 nm, and square Al dots 1605 each having a width of 52 nm are formed in a 104-nm pitch. In this embodiment, the PIN diode area is decreased by the TFT area. Accordingly, the pitch of Al dots is decreased to obtain enough dots, the number of which is sufficient for obtaining the plasmon resonance effect. Subsequently, an oxide film 1606 having a thickness of 200 nm is deposited using CVD, and flattened by CMP using the Al dots 1605 as a stopper. Thereafter, contact holes are formed in the oxide film 1606 and filled with tungsten, thereby forming a common p-type contact 1607 of the photoelectric conversion layers. At this time, as in the case of the first embodiment, a contact (not shown in the drawing) for electrically connecting the in-pixel transistor and the photoelectric conversion layer for detecting light in the green wavelength band is also formed.

Figure 26:
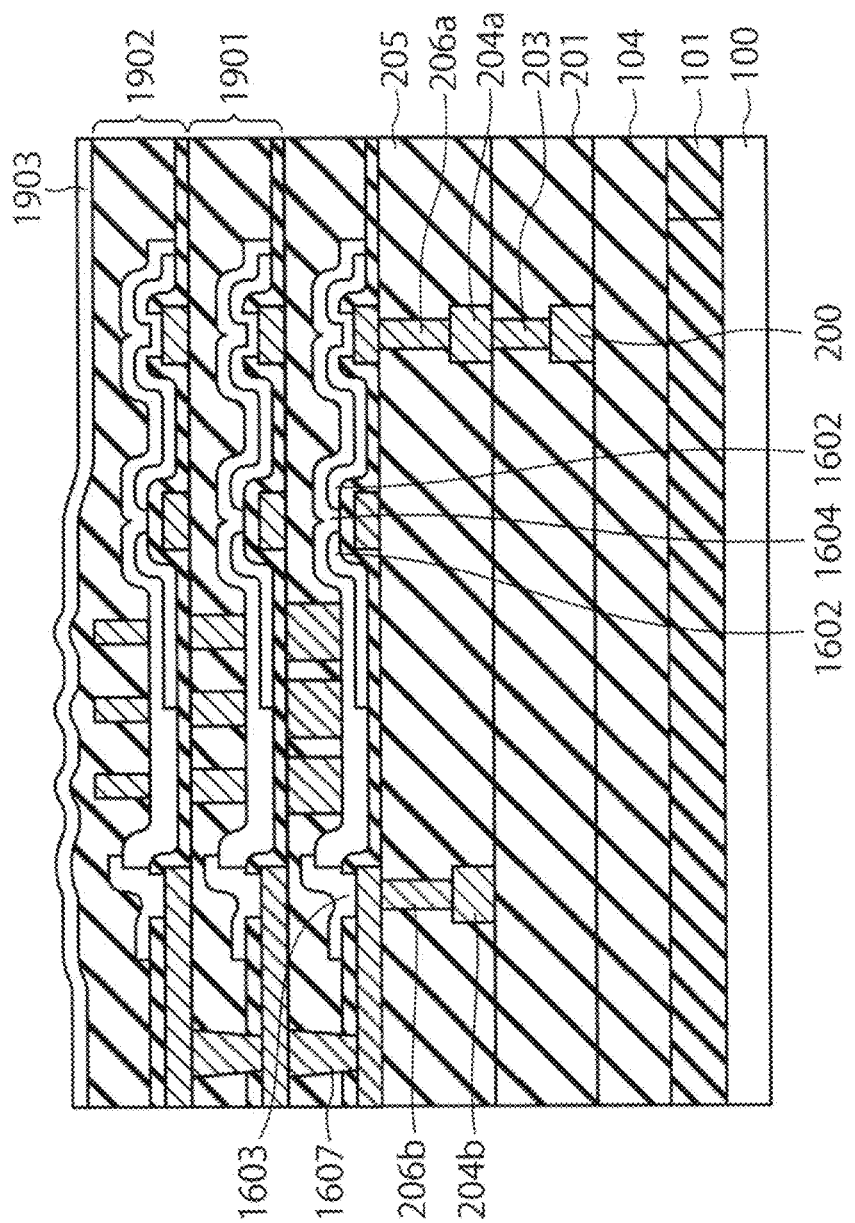
FIG. 26 is a cross-sectional view showing the process of manufacturing the solid state imaging device according to the second embodiment.

Next, as shown in FIG. 26, in the same manner as described above, a photoelectric conversion layer 1901 for absorbing light in the green wavelength band and a photoelectric conversion structure 1902 for absorbing light in the blue wavelength band are formed. On such an occasion, the width, the pitch, and the thickness of the Al dots in the photoelectric conversion structure 1901 are 48 nm, 104 nm, and 50 nm, respectively, and the width, the pitch, and the thickness of the Al dots in the photoelectric conversion structure 1902 are 30 nm, 104 nm, and 40 nm, respectively. Incidentally, in the photoelectric conversion structure 1902, CMP for exposing the upper surfaces of the Al dots is not performed, but SiN to serve as a passivation film 1903 is deposited by CVD so as to have a thickness of 300 nm, and a sintering process is performed.

As described above, in an RGB stacked layer structure, it is possible to provide a CMOS image sensor to obtain gain by means of a floating diffusion and to remove reset noise.

Thus, it is possible to design the peak intensity and the shape of plasmon resonance light by changing the thickness of Al dots in each of the R, G, and B layers, and to design the absorptivity and the transmittance to a lower layer of each of R, G, and B layers by changing the thickness of the a-Si layer serving as a light absorption band.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An imaging device, comprising:
   a photo detector provided in a semiconductor substrate;
   a first photoelectric conversion layer provided above the photo detector;
   a plurality of first metal dots provided above the first photoelectric conversion layer;
   a second photoelectric conversion layer provided above the first metal dots; and
   a plurality of second metal dots provided above the second photoelectric conversion layer,
   wherein each of the first and second metal dots includes an upper metal member and a lower metal member each having a different width, and a width of the upper metal member of one of the first and second metal dots, which is more distant from a face from which light is incident, is the same as a width of the lower metal member of the other, which is closer to the face from which light is incident.

2. The device according to claim 1, wherein the first metal dots are arranged along a line in a constant pitch, and the second metal dots are also arranged along a line in another constant pitch, and a width of one of the first and second metal dots, which is more distant from a face from which light is incident, is wider than a width of the other, which is closer to the face from which light is incident.

3. The device according to claim 1, wherein under the first photoelectric conversion layer, a metal film for reflecting incident light is provided.

4. The device according to claim 1, wherein the first and second metal dots are formed of any of Al, Ag, Au, and Pt.

5. The device according to claim 1, wherein the first and second photoelectric conversion layers are formed of any of a-Si, polycrystalline Si, and polycrystalline Ge.

6. The device according to claim 1, wherein the first and second photoelectric conversion layers each have a thickness of not more than 100 nm.

7. The device according to claim 1, further comprising:
   a first transparent dielectric film provided to be in contact with upper surfaces of the first metal dots; and
   a second transparent dielectric film provided to be in contact with upper surfaces of the second metal dots;
   wherein lower surfaces of the first metal dots are in contact with the first photoelectric conversion layer, and lower surfaces of the second metal dots are in contact with the second photoelectric conversion layer.

8. The device according to claim 7, wherein the first and second transparent dielectric films each include at least one of a silicon oxide layer and a silicon nitride layer, and each have a thickness of 2 nm to 10 nm.

* * * * *